United States Patent [19]

Scholder et al.

[11] Patent Number: 5,684,271
[45] Date of Patent: Nov. 4, 1997

[54] CONFIGURATIONALLY VARIABLE COMPUTER CHASSIS/EMI SHIELD APPARATUS AND ASSOCIATED FABRICATION METHODS

[75] Inventors: Erica J. Scholder; Karl M. Steffes, both of Austin, Tex.

[73] Assignee: Dell USA, L.P., Round Rock, Tex.

[21] Appl. No.: 276,181

[22] Filed: Jul. 14, 1994

[51] Int. Cl.[6] ................................................ H05K 9/00
[52] U.S. Cl. ................. 174/35 R; 361/818; 361/816; 361/752; 361/796; 174/51
[58] Field of Search .................................. 361/816, 817, 361/818, 683, 684, 685, 686, 752, 753, 796, 799, 800, 736, 825, 797, 798, 730; 174/35 R, 35 MS, 35 GC, 51

[56] References Cited

U.S. PATENT DOCUMENTS 5,347,430  9/1994  Curlee et al. ........................ 361/816

*Primary Examiner*—Kristine Kincaid
*Assistant Examiner*—Kristina Soderquist
*Attorney, Agent, or Firm*—Skjerven, Morrill, MacPherson, Franklin & Friel, L.L.P.; Stephen A. Terrile

[57] ABSTRACT

A computer chassis has an exterior wall on the inner side of which a metal EMI shield wall is mounted, the shield wall having a grounding portion that projects outwardly through the chassis wall. A selected one of a plurality of circuit boards may be operatively installed within the chassis, the circuit boards having mutually different through-chassis component connection access opening requirements. Circuit board component connection access openings are formed through the exterior chassis and EMI shield walls to accommodate the circuit board having the maximum access opening requirement. To modify the effective chassis connection opening pattern as required for the other circuit boards, without having to redesign the chassis for each of the other circuit boards, a plurality of metal cover grounding plates are provided. Each of the plates is associated with one of the circuit boards and has connection openings formed therein to match the chassis opening requirements of the associated circuit board. When a selected circuit board is installed in the chassis its associated plate is adhesively secured to the outer side of the exterior chassis wall and permits connection access to the circuit board only via the chassis wall connection openings required by the installed circuit board. The secured plate member has a nonadhered bare metal portion that contacts the grounding portion of the shield wall, thereby grounding the plate member to the shield wall.

22 Claims, 3 Drawing Sheets

CONFIGURATIONALLY VARIABLE COMPUTER CHASSIS/EMI SHIELD APPARATUS AND ASSOCIATED FABRICATION METHODS

BACKGROUND OF THE INVENTION

The present invention generally relates to computer apparatus, and more particularly relates to the chassis and related EMI shield portions of a computer.

Even using the most advanced CAD tools, designing, tooling and producing a computer chassis is a task that typically requires several months from start to finish. In order for a computer manufacturer to stay competitive and to introduce new products to the market very quickly, it is necessary that a single chassis of a particular design be able to accept different motherboards and accessory boards.

One challenge in designing a chassis to achieve this goal is that each motherboard has different components that have to be accessible from the outside of the chassis. These components include, for example, connectors for peripherals, network connectors, LED indicators, function buttons/switches, etc. In order to provide external access to such components it is necessary to provide an appropriate opening through the chassis for each motherboard component to which access is needed. When a different motherboard is to be used, the size and location of these access openings in the chassis correspondingly change. Because of this, it has heretofore been necessary to provide an at least partially modified chassis design for each differently configured motherboard desired to be used.

This previous design necessity, of course, is decidedly undesirable from production and competitiveness standpoints. It is accordingly an object of the present invention to provide a single computer chassis design that will accommodate, from an external access opening standpoint, the components of a variety of differently configured motherboards.

SUMMARY OF THE INVENTION

In carrying out principles of the present invention, in accordance with a preferred embodiment thereof, a computer chassis is constructed using a method permitting the same chassis to have installed therein a selected one of a plurality of circuit boards having mutually different through-chassis component connection access requirements without redesigning the chassis for each of the circuit boards.

From a broad perspective, the construction method is carried out by providing a computer chassis having an interior space and an exterior wall with a spaced plurality of connection openings extending therethrough. Additionally, a plurality of circuit boards are provided, any selected one of which may be operatively installed in the interior of the chassis. The circuit boards have mutually different through-chassis component connection access opening requirements, and the connection openings in the exterior chassis wall are configured and arranged to provide component connection access to any selected one of the circuit boards operatively installed in the chassis interior.

To give the single computer chassis a multi-port configuration without redesigning and reconfiguring it for each of the different circuit boards, a plurality of plate members having differently configured opening means therein are provided. Each of the plate members is associated with a different one of the circuit boards and has a side securable to the outer side of the exterior chassis wall over the connection openings therein. The opening means in each plate member, when the plate member is operatively secured to the exterior chassis wall, are configured and arranged to provide circuit board component connection access to its associated circuit board installed within the chassis only via the exterior chassis wall connection opening or openings needed by the installed circuit board.

To complete the construction of the computer chassis a selected one of the differently configured circuit boards is installed in the interior of the chassis, and the plate member associated with the selected circuit board is operatively secured to the outer side of the exterior chassis wall over the connection openings therein.

According to another aspect of the invention, each of the plates is of a metal material and has an adhesive material applied to a first portion of an inner side thereof, and a second portion of each inner plate is a bare metal portion devoid of adhesive. When any of the plates is adhesively secured to the outer side of the exterior chassis wall the metal shield wall grounding portion contacts the second portion of the inner plate side, thereby electrically grounding the installed plate to the metal shield wall.

Thus, by utilizing the specially designed plate members the completed chassis apparatus is useable, without redesign or reconfiguration thereof, in conjunction with a variety of differently configured circuit boards that may be selectively installed within the interior of the chassis apparatus.

DETAILED DESCRIPTION

Figure 1:
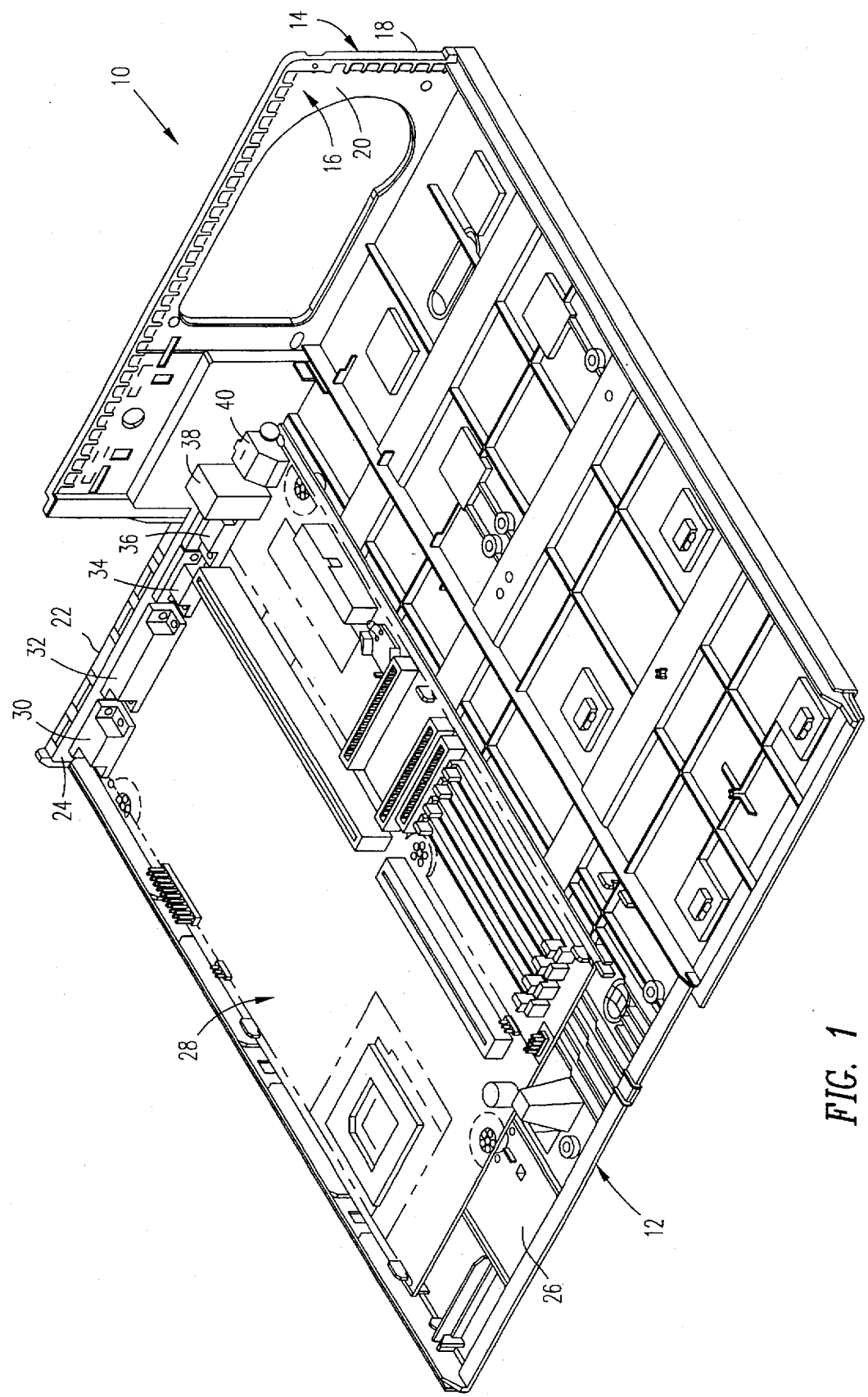
FIG. 1 is a front and right side perspective view of a portion of a representative computer chassis/EMI shield structure embodying principles of the present invention.

Referring initially to FIG. 1, the present invention provides a configurationally variable computer chassis/EMI shield structure 10, only a representative portion of which is illustrated. The structure 10 includes a plastic chassis portion having a horizontally oriented bottom wall 12 and an upstanding rear side wall 14 extending along the rear edge of the bottom wall 12, and a sheet metal EMI shield wall 16.

The metal EMI shield wall 16 has a configuration complementary to that of the rear chassis side wall 14 and is appropriately secured to its inner side. Specifically, along the right sides thereof as viewed in FIG. 1, the chassis and metal shield walls 14,16 have aligned rectangular wall portions 18 and 20, and along the left sides thereof as viewed in FIG. 1, the chassis and metal shield walls 14,16 have vertically shorter aligned rectangular wall portions 22 and 24. EMI shielding of the bottom chassis wall 12 is representatively provided by a coat of electrically conductive metallic paint 26 applied to its top side.

Figure 2:
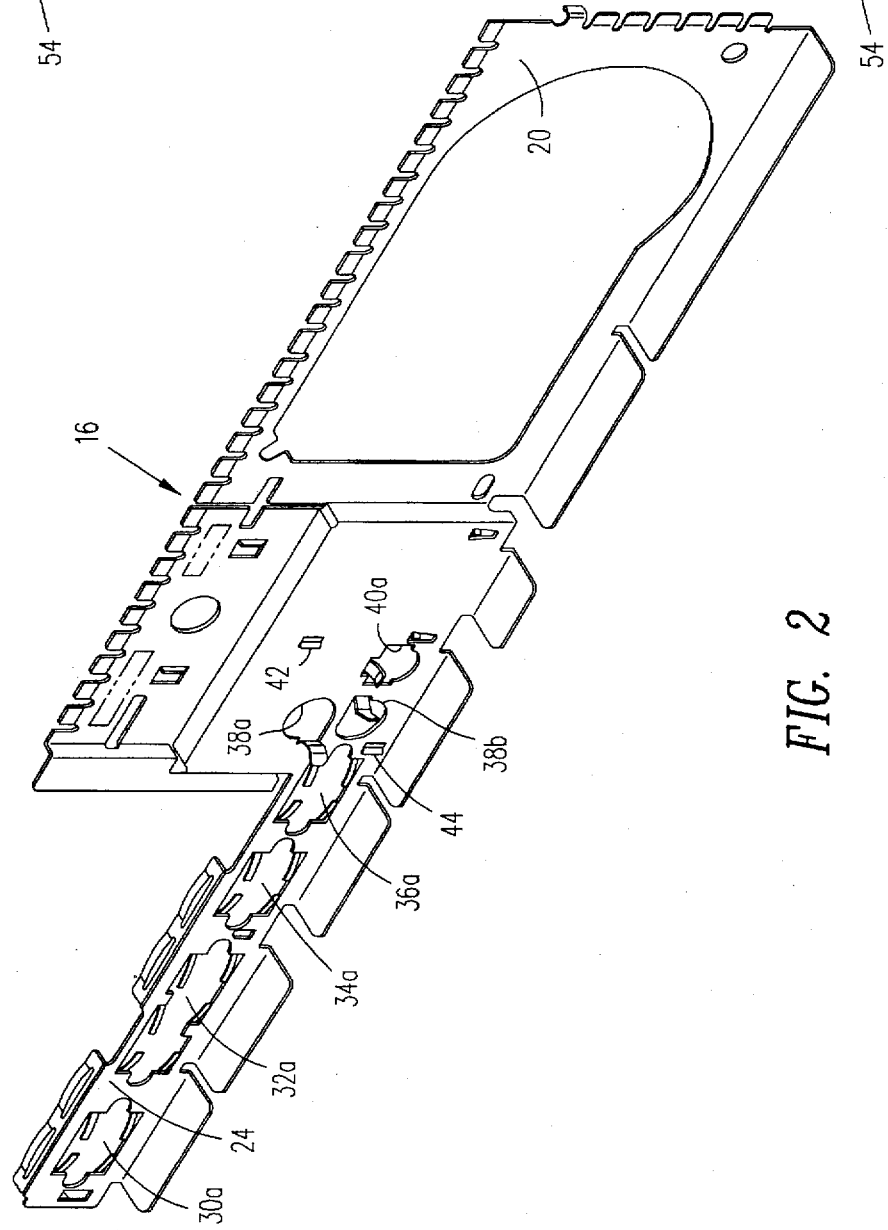
FIG. 2 is an enlarged scale perspective view of a sheet metal EMI shield portion of the structure removed from the rear side thereof for illustrative purposes.
Figure 3:
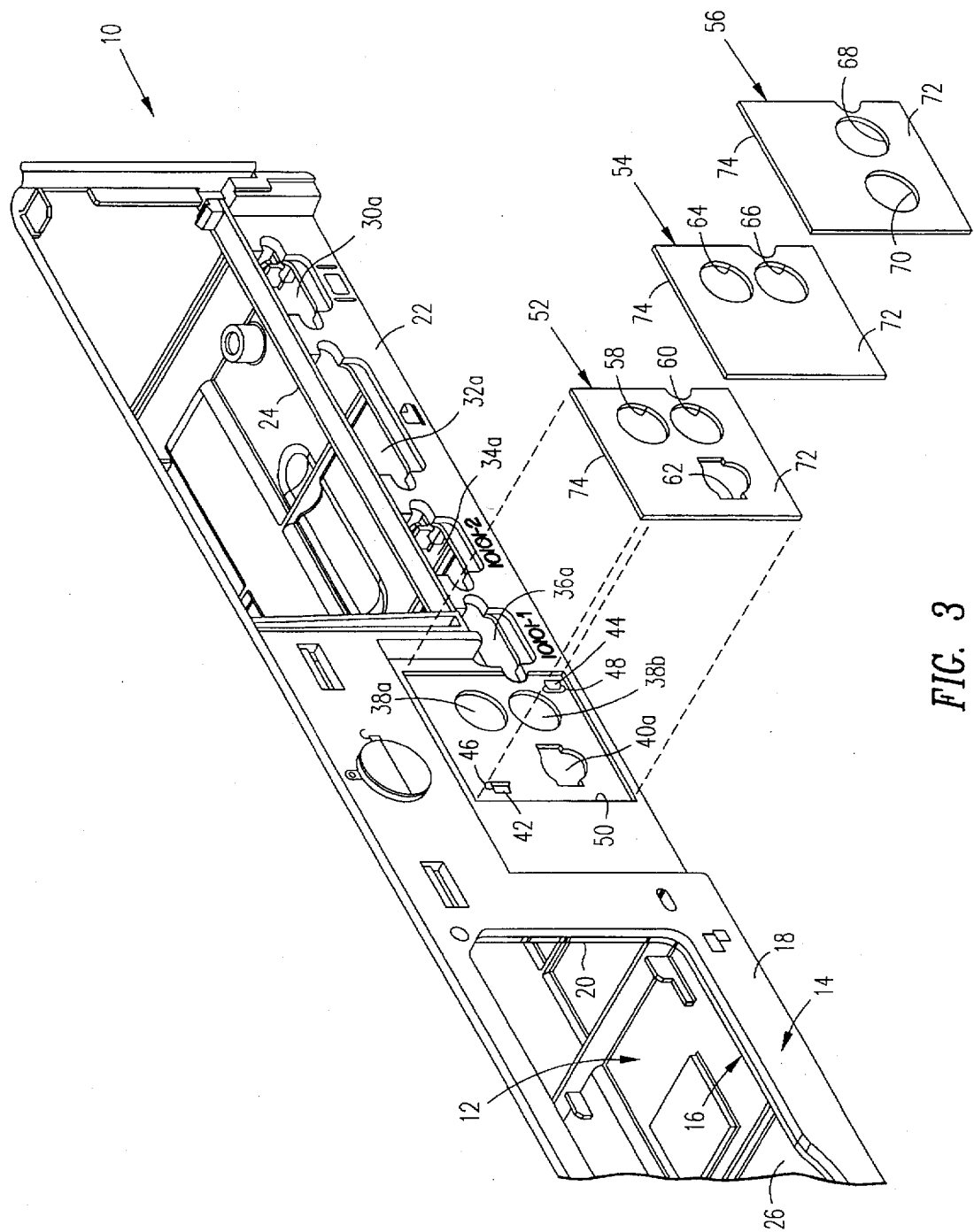
FIG. 3 is an enlarged scale partial rear side perspective view of the structure and further illustrates three representative adhesive metal external cover/EMI shield plates that embody principles of the present invention and may be alternatively secured to the computer chassis to convert it for use with motherboards having different external connection requirements.

Referring now to FIGS. 1–3, a motherboard 28 (shown only in FIG. 1) is suitably secured to a left portion of the top side of the bottom chassis wall 12 and is one of several motherboard configurations (representatively three) that the same chassis/EMI shield structure is uniquely configured to accommodate according to unique features of the present invention subsequently discussed herein. The motherboard 28 (see FIG. 1) has, from left to right along its rear side edge a series of connector components 30,32,34,36,38 and 40 to which external connection access must be provided through the rear side of the chassis/EMI shield structure 10. Representatively, the connector 38 is a vertically stacked mouse/keyboard connector, and the connector 40 is a network connector.

To provide external connection access to the connectors 30,32,34,36,38 and 40 a series of aligned connection openings 30a,32a,34a,36a,38a,38b and 40a are formed through the rear chassis wall 14 and the EMI shield wall 16 as illustrated in FIGS. 2 and 3. With the motherboard 28 installed in the chassis, these openings complementarily receive rear side portions of the connectors, exposing the rear side portions for external connection at the rear side of the computer chassis. Specifically, the openings 30a complementarily receive a rear side portion of the connector 30; the openings 32a complementarily receive a rear side portion of the connector 32; the openings 34a complementarily receive a rear side portion of the connector 34; the openings 36a complementarily receive a rear side portion of the connector 36; the opening pairs 38a and 38b respectively and complementarily receive top and bottom rear side portions of the connector 38; and the openings 40a complementarily receive a rear side portion of the connector 40.

For purposes later described, a pair of small rectangular tab portions 42, 44 of the metal EMI shield wall 16 (see FIG. 3) respectively project outwardly through a pair of slots 46,48 formed through the rear chassis wall 14. The slots 46, 48 are disposed within a generally square inset area 50 formed in the rear chassis wall 14 and extending around the connection opening pairs 38a, 38b and 40a.

As previously mentioned, according to a key feature of the present invention the same chassis/EMI shield structure 10 accommodates, without configurational modification thereof, the illustrated motherboard 28 as well as two other motherboards representatively having different connector opening requirements at the location of the chassis inset area 50. For purposes of illustration and discussion it will be assumed that (1) the illustrated opening pairs 30a,32a,34a, 36a,38a,38b and 40a which accommodate the connector components of the motherboard 28 represent the maximum number of connector openings required for any of the three motherboards, and (2) the chassis connector opening requirements of the other two motherboards vary only at the rear side chassis location within the inset chassis area 50.

The fabrication of the rear side portion of the chassis/EMI shield structure 10 illustrated in FIG. 3 is completed using one of three generally square, differently apertured thin metal exterior chassis cover/grounding plates 52,54 and 56, the particular plate to be used being dictated by which one of the three motherboards is to be installed in the computer chassis. In a manner subsequently described, the required one of the three plates 52,54,56 is adhesively secured within the inset chassis area 50 and is electrically grounded to the shield wall tabs 42, 44 thereon.

The plate 52, used when the illustrated motherboard 28 is installed in the computer chassis, has openings 58,60,62 therein. When the plate 52 is secured within the inset chassis area 50, the plate openings 58,60,62 are respectively aligned and generally congruent with the chassis/shield openings 38a,38b and 40a and provide external plug-in access to the motherboard connectors 38 and 40 (see FIG. 1) via the chassis/shield openings 38a,38b,40a.

The second plate 54 is used in conjunction with a second motherboard which representatively has the same dual mouse/keyboard connector 38, but does not have the network connector 40. Accordingly, when this second motherboard is installed in the computer chassis, the previously formed chassis/shield opening pair 40a are not needed for connector access purposes. Plate 54 has, along its right side, a pair of vertically stacked circular openings 64,66 therein which, when the plate 54 is secured within the inset chassis area 50, are respectively aligned and generally congruent with the chassis/shield openings 38a and 38b. However, there is no opening in the plate 54 that corresponds to the chassis/shield opening pair 40a. Accordingly, when the plate 54 is installed in the inset chassis area 50, the plate blanks off the unused chassis/shield opening pair 40a, thereby preventing radiation leaks outwardly through these unoccupied chassis openings.

The third plate 56 is used in conjunction with a third motherboard that, at the location of the connector 38 of the motherboard 28, has a connector that occupies only the bottom circular chassis/shield opening pair 38b and, at the location of the connector 40 of the motherboard 28, requires a circular opening at the location of the irregularly shaped chassis/shield opening pair 40a. As illustrated in FIG. 3, the third plate 56 has, along its bottom side, a pair of circular openings 68 and 70. When the plate 56 is secured within the inset chassis area 50, the plate opening 68 is aligned and congruent with the chassis/shield opening pair 38b, the plate 56 blanks off the unused chassis/shield opening pair 38a, and the circular plate opening 70 is positioned over the irregularly shaped chassis/shield opening pair 40a to complementarily receive the differently configured connector portion at that location.

Figure 4:
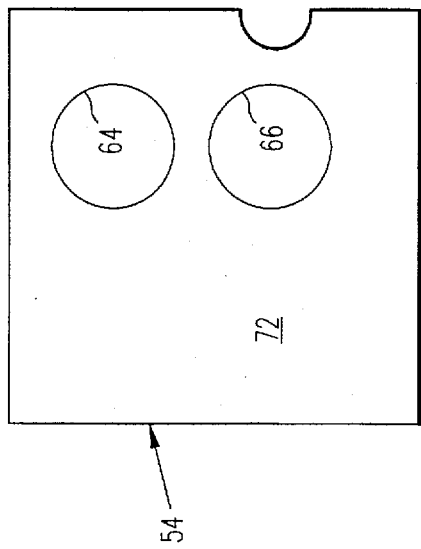
FIG. 4 is an enlarged scale rear or outer side elevational view of one of the plates.
Figure 5:
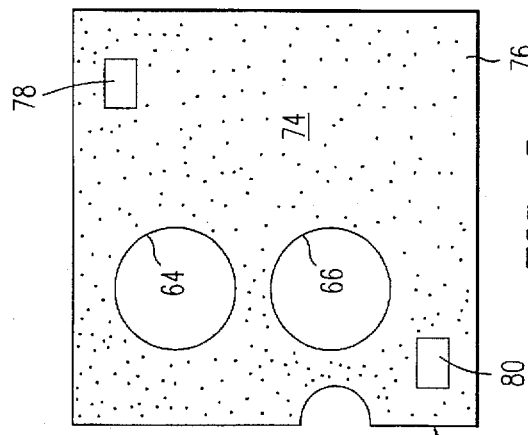
FIG. 5 is an enlarged scale front or inner side elevational view of the plate.

Referring now to FIGS. 3–5, each of the three differently apertured plates 52,54,56 has an outer side 72. As representatively illustrated in FIG. 5 for the plate 54, each of the plates 52,54,56 has a layer of suitable adhesive material 76 deposited on its inner side 74. The adhesive material 76 covers the entire inner side of each plate except at two bare metal areas 78 and 80 thereon. These bare metal areas 78, 80 are positioned on each plate in a manner such that when the selected plate is adhered to the inset chassis area 50 (see FIG. 3), the bare metal plate areas 78 and 80 are respectively brought into contact with the shield tabs 42 and 44, thereby electrically grounding the plate to the metal shield wall 16.

As can readily seen from the foregoing, the same chassis/EMI shield structure 10 can be used in conjunction with the specially designed plates 52,54,56 to configurationally accommodate three different motherboards having mutually different external connector access requirements without undesirably leaving exposed, unoccupied connector openings at the back of the computer chassis. This desirable cost saving advantage is achieved by forming in the chassis and EMI shield walls 14,16 the total number of openings required to accommodate the connector access requirements for all of the motherboards which may be alternately installed in the computer chassis. A selected one of the three plates 52,54,56 is then incorporated in the chassis/EMI shield structure 10 to conform the structure from a rear connector opening standpoint to the actual motherboard being used. In combination, these two fabrication techniques advantageously avoid the need to provide differently configured chassis and EMI shield walls 14,16 for each of the three motherboards.

It will be readily appreciated that the use of a combination of three differently apertured cover/grounding plates and three alternate motherboards having mutually different connector access requirements is merely representative of principles of the present invention. A greater or lesser number of motherboards, and associated cover/grounding plates, could be utilized if desired to provide the configurationally variable chassis/EMI shield apparatus of the present invention.

Moreover, the three illustrated cover/grounding plates 52,54,56 have been shown as being usable in conjunction only with the chassis/shield wall opening pairs 38a,38b, and 40a, with all of the other illustrated connector opening pairs 30a,32a,34a,36a being used with each of the three representative motherboards. However, by simply reconfiguring the cover/grounding plates to additionally extend over these additional connector opening pairs, changes in external access requirements at these connector openings could easily be accommodated as well.

The foregoing detailed description is to be clearly understood as being given by way of illustration and example only, the spirit and scope of the present invention being limited solely by the appended claims.

What is claimed is:

1. A computer apparatus comprising:
   an exterior chassis wall having opposite inner and outer sides;
   a metal EMI shield wall having inner and outer sides, said outer side positioned against said inner side of said exterior chassis wall, said EMI shield wall further having a grounding portion extending outwardly through said exterior chassis wall;
   a spaced plurality of connection openings extending through said chassis and EMI shield walls and through which connection access is provided at the outer side of the exterior chassis wall for circuit board components positionable along said inner side of said EMI shield wall adjacent said connection openings; and
   a metal cover/grounding plate having opposite first and second sides and opening means extending between said first and second sides,
   said first side having a first, adhesive covered portion adhering said first side to said outer side of said exterior chassis wall with at least a portion of said opening means being aligned with at least one of said connection openings and a second, bare metal portion contacting said EMI shield wall and electrically grounding said cover/grounding plate to said EMI shield wall.

2. The computer apparatus of claim 1 wherein said opening means in said cover/grounding plate include:
   an opening aligned and substantially congruent with one of said connection openings.

3. The computer apparatus of claim 1 wherein said opening means in said cover/grounding plate include:
   an opening substantially aligned with but of a different shape than one of said connection openings.

4. The computer apparatus of claim 1 wherein:
   said cover/grounding plate has a portion that covers and blanks off one of said connection openings.

5. The computer apparatus of claim 1 wherein said opening means in said cover/grounding plate include:
   a plurality of openings equal in number, aligned, and substantially congruent with said connection openings.

6. A computer apparatus comprising:
   a chassis structure within which a selected one of a first circuit board and a second circuit board may be operatively installed, the first and second circuit boards having mutually different external through-chassis connection access opening requirements for components mounted thereon, said chassis structure including an external chassis wall having an inner side and an outer side, and a plurality of connection openings extending through said external chassis wall, said connection openings being configured and arranged to provide external connection access to the components of said selected one of the first and second circuit boards; and
   first and second plate members respectively useable in conjunction with the first and second circuit boards and each having an inner side securable against said outer side of said external chassis wall over said connection openings therein, said first and second plate members respectively having first and second opening means therein,
   said first and second opening means being differently configured and respectively operative, when their associated plate member is operatively secured to said external chassis wall, to provide component connection access to the first and second circuit board components only via at least one of the connection openings needed by such components, whereby either of the first and second circuit boards may be installed in said chassis structure without modification of said connection openings.

7. The computer apparatus of claim 6 wherein:
   said computer apparatus further comprises a metal EMI shield wall positioned inwardly against said external chassis wall and having connection openings aligned and substantially congruent with said connection openings in said external chassis wall,
   said first and second plate members are of a metal material, and
   said computer apparatus further comprises:
   means for adhesively securing the inner side of said selected one of said first and second plate members to said outer side of said external chassis wall over said connection opening means therein, and
   means for electrically grounding the selected one of said first and second plate members to said outer side of said external chassis wall over said connection openings therein.

8. The computer apparatus of claim 7 wherein said means for adhesively securing include:
   an adhesive material disposed on a first portion of said inner side of the selected one of said first and second plate members.

9. The computer apparatus of claim 8 wherein:
   a grounding portion of said metal EMI shield wall projects outwardly through said external chassis wall, and
   said means for electrically grounding include said shield wall grounding portion and second, bare metal portions of said inner sides of said first and second plate members positioned thereon to be engaged by said shield wall grounding portion when the selected plate member is adhesively secured to said outer side of said chassis wall over said connection openings therein.

10. The computer apparatus of claim 9 wherein:
    said external chassis wall has a spaced plurality of slots disposed therein adjacent said chassis wall connection openings, and said grounding portion of said metal EMI shield wall comprises a spaced plurality of tab portions of said shield wall that extend outwardly through said slots and are bent over onto said outer side of said external chassis wall.

11. The computer apparatus of claim 6 wherein:

one of said opening means in said first plate member is positioned and configured to be aligned and substantially congruent with one of said shield wall connection openings when said first plate member is operatively secured to said outer side of said external chassis wall over said connection openings therein.

12. The computer apparatus of claim 6 wherein:

one of said opening means in said first plate member is positioned and configured to be substantially aligned with but of a different shape than one of shield wall connection openings when said first plate member is operatively secured to said outer side of said external chassis wall over said connection openings therein.

13. The computer apparatus of claim 6 wherein:

said first plate member is configured to cover and blank off one of said connection openings in said external chassis wall when said first plate member is operatively secured to said outer side of said external chassis wall over said connection openings therein.

14. The computer apparatus of claim 6 wherein:

the number of said first opening means in said first plate member is equal in number to the number of said connection openings in said external chassis wall, and said first opening means in said first plate member are positioned and configured to be aligned and substantially congruent with said connection openings in said external chassis wall when said first plate member is operatively secured to said outer side of said external chassis wall over said connection openings therein.

15. A method of constructing a computer comprising the steps of:

providing a chassis having an interior space and an exterior wall with a spaced plurality of connection openings extending therethrough;

providing a plurality of circuit boards, any selected one of which may be operatively installed in the interior space of said chassis, the plurality of circuit boards having mutually different through-chassis component connection access opening requirements, said connection openings in said exterior chassis wall being configured and arranged to provide component connection access to any selected one of said plurality of circuit boards operatively installed in the interior space of said chassis;

providing a plurality of plate members having differently configured opening means therein, each of said plurality of plate members being associated with a different one of said plurality of circuit boards and having a first side securable to an outer side of said exterior chassis wall over said connection openings therein, the opening means in each plate member, when the plate member is operatively secured to said exterior chassis wall, being configured and arranged to provide component connection access to its associated circuit board when the associated circuit board is installed within said chassis only via at least one of the exterior chassis wall connection openings needed by the associated circuit board when installed;

installing a selected one of said plurality of circuit boards in the interior space of said chassis; and operatively securing to the outer side of said exterior chassis wall, over said connection openings therein, the plate member associated with the selected circuit board.

16. The method of claim 15 wherein:

each of said plurality of plate members is of a metal material, and said method further comprises the steps of:

installing a metal EMI shield wall on an inner side of said exterior chassis wall, the installed metal EMI shield wall having a plurality of connection openings therein that define inward continuations of said connection openings in said exterior chassis wall, and electrically grounding said metal EMI shield wall to the plate member operatively secured to the outer side of said exterior chassis wall.

17. The method of claim 16 wherein:

said operatively securing step is performed by depositing an adhesive material on a first portion of said first side of each of said plurality of plate members, and adhesively securing the selected plate member to the outer side of said exterior chassis wall over said connection openings therein.

18. The method of claim 17 wherein:

said electrically grounding step is performed by extending a grounding portion of said metal EMI shield wall outwardly through said exterior chassis wall adjacent said connection openings therein, leaving a second, bare metal portion on said first side of each of said plurality of plate members, and causing said grounding portion to engage said second, bare metal portion of the selected plate member operatively secured to the outer side of said exterior chassis wall over said connection openings therein.

19. The method of claim 15 further comprising the step of:

configuring the opening means in the one of said plate members to include a connection opening shaped and positioned to be aligned and substantially congruent with one of said exterior chassis wall connection openings when said one of said plate members is operatively secured to the outer side of said exterior chassis wall over said connection openings therein.

20. The method of claim 15 further comprising the step of:

configuring the opening means in the one of said plate members to include a connection opening shaped and positioned to be substantially aligned with but of a different shape than one of said exterior chassis wall connection openings when said one of said plate members is operatively secured to the outer side of said exterior chassis wall over said connection openings therein.

21. The method of claim 15 further comprising the step of:

configuring the one of said plate members to have a portion which covers and blanks off one of said exterior chassis wall connection openings when said one of said plate members is operatively secured to the outer side of said exterior chassis wall over said connection openings therein.

22. The method of claim 15 further comprising the step of:

configuring the opening means in one the of said plate members to comprise a spaced plurality of connection openings identical in number, spacing and configurations to the number, spacing and configurations of said connection openings in said exterior chassis wall.

* * * * *

UNITED STATES PATENT AND TRADEMARK OFFICE
CERTIFICATE OF CORRECTION

PATENT NO.    : 5,684,271
DATED         : November 4, 1997
INVENTOR(S)   : Scholder et al.

It is certified that error appears in the above-identified patent and that said Letters Patent is hereby corrected as shown below:

Column 7, line 60,
Delete "wail" and insert --wall--

Signed and Sealed this

Twenty-eighth Day of July, 1998

Attest:

BRUCE LEHMAN

Attesting Officer

Commissioner of Patents and Trademarks